(12) United States Patent
Sugibuchi et al.

(10) Patent No.: US 7,973,379 B2
(45) Date of Patent: Jul. 5, 2011

(54) PHOTOVOLTAIC ULTRAVIOLET SENSOR

(75) Inventors: Mayo Sugibuchi, Morioka (JP);
Kohsuke Takahashi, Morioka (JP);
Shunsuke Goto, Iwate-gun (JP); Yasube Kashiwaba, Morioka (JP); Haruyuki Endo, Morioka (JP); Tatsuo Hasegawa, Morioka (JP); Fukunori Izumida, Morioka (JP); Eriko Ohshima, Morioka (JP)

(73) Assignees: Citizen Holdings Co., Ltd., Tokyo (JP);
Local Independent Administrative Agency Iwate Industrial Research Institute, Iwate (JP); Incorporated National University Iwate University, Iwate (JP)

( * ) Notice: Subject to any disclaimer, the term of this patent is extended or adjusted under 35 U.S.C. 154(b) by 958 days.

(21) Appl. No.: 11/388,052

(22) Filed: Mar. 23, 2006

(65) Prior Publication Data
US 2007/0145499 A1 Jun. 28, 2007

(30) Foreign Application Priority Data

Dec. 26, 2005 (JP) ................................. 2005-371374

(51) Int. Cl.
*H01L 31/07* (2006.01)

(52) U.S. Cl. ................................. 257/449; 257/E31.074

(58) Field of Classification Search .................. 257/451, 257/461, 464, E31.074, E31.075
See application file for complete search history.

(56) References Cited

U.S. PATENT DOCUMENTS

| | | | |
|---|---|---|---|
| 5,847,397 A * | 12/1998 | Moustakas | 250/370.06 |
| 6,673,478 B2 * | 1/2004 | Kato et al. | 428/698 |
| 2001/0017257 A1 * | 8/2001 | Choi et al. | 204/192.22 |
| 2003/0160176 A1 * | 8/2003 | Vispute et al. | 250/372 |
| 2005/0098844 A1 * | 5/2005 | Sandvik et al. | 257/438 |
| 2005/0145970 A1 * | 7/2005 | Lu et al. | 257/449 |
| 2006/0233969 A1 * | 10/2006 | White et al. | 427/576 |

FOREIGN PATENT DOCUMENTS

| | | | |
|---|---|---|---|
| EP | 1349203 A | | 10/2003 |
| JP | 3-241777 A | | 10/1991 |
| JP | 10-182290 A | | 7/1998 |
| JP | 2002105625 A | * | 4/2002 |
| JP | 2006-278487 A | | 10/2006 |

OTHER PUBLICATIONS

Fabricius et al., "Ultraviolet ditectors in thin sputtered ZnO films," Aug. 15, 1986, Applied Optics, vol. 25, No. 16, pp. 2764-2767.*
S. -H. Kim, H. -K Kim, and T. -Y. Seong: "Effect of Hydrogen peroxide treatment on characteristic of Pt Schottky contact on n-type ZnO" *App. Phys. Lett.*, vol. 86, Mar. 2005, pp. 112101-1 to 112101-3.
Ip et al: "Contacts to ZnO" *Journal of Crystal Growth*, Elsevier, Amsterdam, NL, vol. 287 No. 1 Dec. 2, 2005, pp. 149-156.

(Continued)

*Primary Examiner* — Allan R Wilson
(74) *Attorney, Agent, or Firm* — Holtz, Holtz, Goodman & Chick, PC

(57) ABSTRACT

A photovoltaic ultraviolet sensor comprises a zinc oxide single crystal substrate. On the +c face of the zinc oxide single crystal substrate, an ultraviolet receiver is formed. The exemplary ultraviolet receiver includes a Schottky electrode which, when receiving ultraviolet rays, produces a voltage in cooperation with the zinc oxide single crystal substrate. The ultraviolet sensor does not have any sensitivity to the visible rays. The ultraviolet sensor has a relatively fast response of several microseconds.

16 Claims, 14 Drawing Sheets

OTHER PUBLICATIONS

Liang S et al: "Zno Schottky utraviolet photo detectors" *Journal of Crystal Growth*, Elsevier, Amsterdam, NL, vol. 225, No. 2-4, May 2001 pp. 110-113.

H. Ko, M. Han, Y. Park, Y. Yu, B. Kim, and J. Kim: "Improvement of the quality of ZnO substrates by annealing", *Journal of Crystal Growth*, Elsevier, Amsterdam, NL, vol. 269, Sep. 2004, pp. 493-498.

Japanese Office Action (Notification of Reason for Refusal) dated Mar. 10, 2011 in Japanese Application No. 2006-088262.

Haruyuki Endo et al., "Studies on ZnO Single Crystal and its Applications," Iwate Industrial Research Institute Study Reports, vol. 12 (2005), pp. 83-86.

* cited by examiner

PHOTOVOLTAIC ULTRAVIOLET SENSOR

BACKGROUND OF THE INVENTION

This invention relates to a photovoltaic ultraviolet sensor comprising a zinc oxide single crystal.

JP-A H03-241777, which is incorporated herein by reference in its entirety, discloses a photoconductive ultraviolet sensor which comprises a substrate and a zinc oxide thin film formed on the substrate. In JP-A H03-241777, the zinc oxide thin film preferably has an optical forbidden band of about 3.0 to about 3.2 eV. However, the zinc oxide thin film of the foregoing optical forbidden band is sensitive also to visible rays and therefore has insufficient sensitivity to ultraviolet rays.

JP-A H10-182290, which is incorporated herein by reference in its entirety, discloses another ultraviolet sensor which comprises a zinc oxide crystal whose "a" face is used as an ultraviolet receiver surface. To sense ultraviolet rays, impedance variation of the zinc oxide crystal is monitored while the zinc oxide crystal is supplied with electric fields according to an antiresonance frequency of the zinc oxide crystal. However, generation of the antiresonance frequency requires special equipment so that the total cost of the ultraviolet sensor becomes high. In addition, the ultraviolet sensor of JP-A H10-182290 has a relatively slow response because of its sensing mechanism.

SUMMARY OF THE INVENTION

It is an object of the present invention to provide an ultraviolet sensor which is not sensitive to visible rays and has a relatively fast response without using complex equipment.

According to one aspect of the present invention, a photovoltaic ultraviolet sensor comprises a zinc oxide single crystal and an ultraviolet receiver. The zinc oxide single crystal has a +c face. The ultraviolet receiver is formed on the +c face of the zinc oxide single crystal and, when receiving ultraviolet rays, produces a voltage solely or in cooperation with the zinc oxide single crystal.

An appreciation of the objectives of the present invention and a more complete understanding of its structure may be had by studying the following description of the preferred embodiment and by referring to the accompanying drawings.

DESCRIPTION OF PREFERRED EMBODIMENTS

Figure 1:
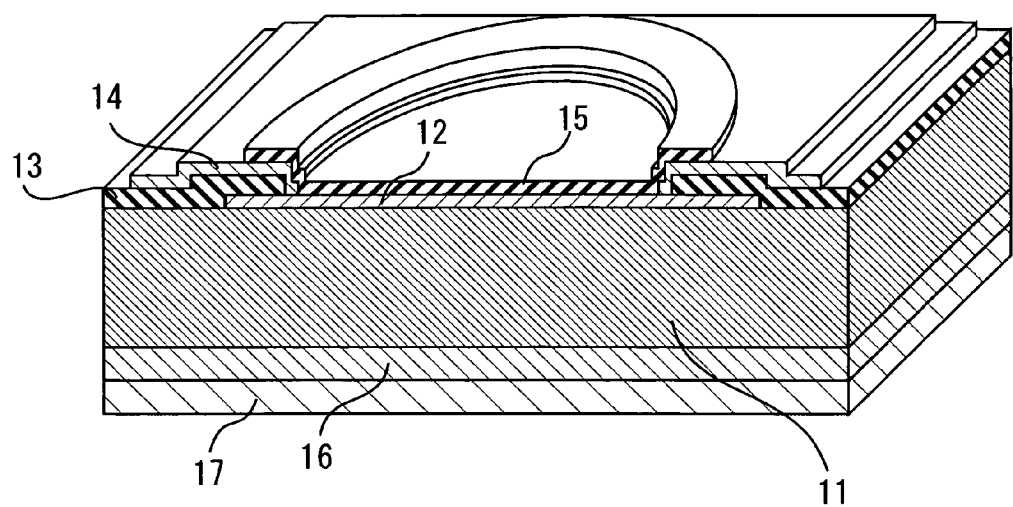
FIG. 1 is a partially-sectional, perspective view showing a photovoltaic ultraviolet sensor according to a first embodiment of the present invention.
Figure 2:
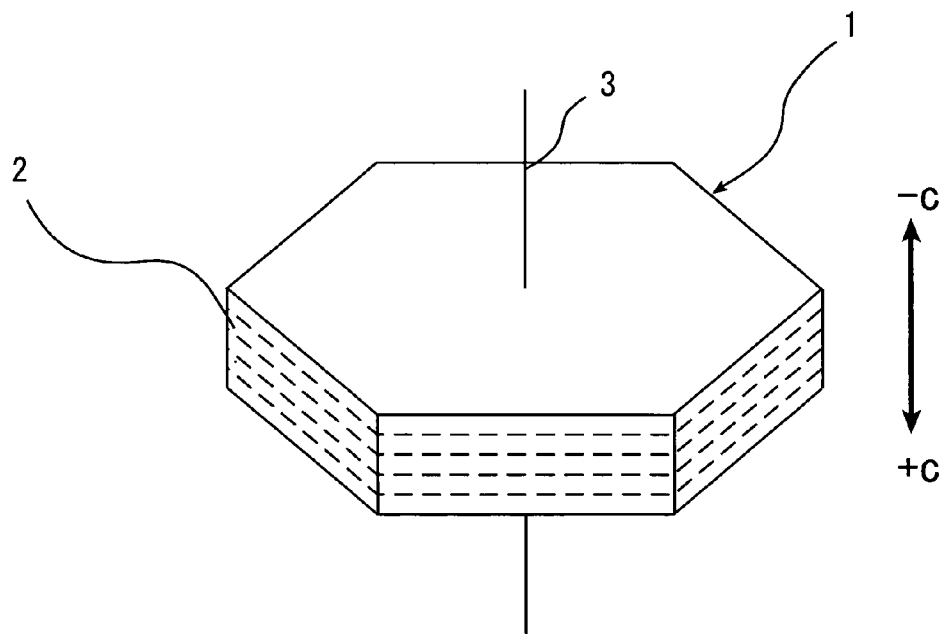
FIG. 2 is a generally schematic view showing a zinc oxide single crystal block.

With reference to FIG. 1, a photovoltaic ultraviolet sensor according to a first embodiment of the present invention comprises a zinc oxide single crystal substrate 11 as a main component. The zinc oxide single crystal substrate 11 is one obtainable by cutting a zinc oxide single crystal 1 as shown in FIG. 2 along with a plane perpendicular to its c axis 3 so as to form a plurality of wafers 2, followed by carrying out a heat treatment for one of the wafers 2 under an oxygen-containing atmosphere within a container made of high-purity zinc oxide. Thus, the heat-treated wafer 2 can be obtained, which includes a plurality of zinc oxide single crystal substrates 11. After a plurality of photovoltaic ultraviolet sensors are formed on the heat-treated wafer 2, the wafer 2 is diced so that the plurality of photovoltaic ultraviolet sensors, i.e. the zinc oxide single crystal substrates 11 are obtained together with predetermined components described hereinafter in detail.

Figure 3:
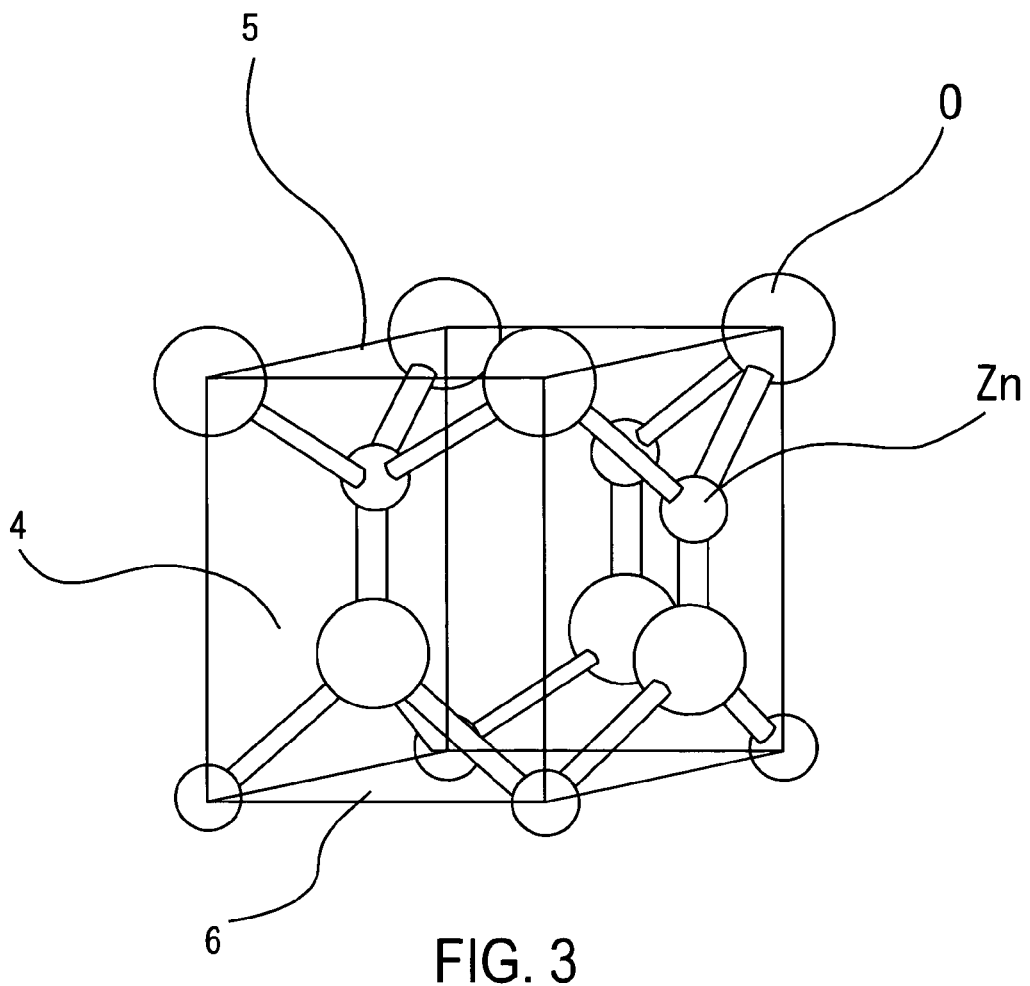
FIG. 3 is a generally schematic view showing a crystal structure of a zinc oxide single crystal.

As apparent from the above description, the zinc oxide single crystal substrate 11 has two surfaces which are +c face and −c face of the zinc oxide single crystal. In detail, as shown in FIG. 3, the −c face 5 of the zinc oxide single crystal is a face defined by four oxygen atoms and is also referred to as "O-face," while the +c face 6 of the zinc oxide single crystal is a face defined by four zinc atoms and is also referred to as "Zn-face." Another face 4 perpendicular to the −c face 5 and +c face 6 is referred to as "a" face. In addition, the zinc oxide single crystal as shown in FIG. 2 is formed in accordance with the hydrothermal synthesis method using LiOH or KOH as a mineralizer. The zinc oxide single crystal may be formed in accordance with another method, for example, vapor deposition method, flux method, scorification method, molecular beam epitaxy (MBE) method, vacuum deposition method, metal organic chemical vapor deposition (MOCVD) method, or spattering method.

Turning back to FIG. 1, the photovoltaic ultraviolet sensor of the present embodiment further comprises an ultraviolet receiver formed on the +c face of the zinc oxide single crystal substrate 11. The ultra violet receiver of the present embodiment is a Schottky electrode 12 formed directly on the +c face of the zinc oxide single crystal substrate 11, for example, under an oxygen atmosphere. The Schottky electrode 12 serves as an ultraviolet receiver surface and, when receiving ultraviolet rays, produces a voltage in cooperation with the zinc oxide single crystal substrate 11. The Schottky electrode 12 may comprise one or more layers, each of which is made of Pt, Ru, Pd, Au, Ni, Ir, Os, Re, Rh, Te or W. The Schottky electrode 12 of the present embodiment has a predetermined thickness such that the Schottky electrode 12 is ultraviolet-permeable. Instead, the Schottky electrode 12 may have another thickness thicker than the predetermined thickness, provided that the Schottky electrode 12 has a special shape such as a comb-like such that ultraviolet rays are allowed to reach the Schottky junction between the Schottky electrode 12 and the +c face 6 of the zinc oxide single crystal.

As shown in FIG. 1, the photovoltaic ultraviolet sensor of the present embodiment further comprises a passivation film 13, an additional electrode 14, an antireflection film 15, an AZO(Al-doped Zinc Oxide) thin film 16 and an ohmic electrode 17.

The passivation film 13 is made of one or more insulator materials and covers a peripheral region on the +c face of the zinc oxide single crystal substrate 11 and a peripheral part of the Schottky electrode 12. The passivation film 13 may comprise at least a layer made of $Al_2O_3$, $SiO_2$, SiNO, SiN, AlN, SIALON(silicon aluminum oxynitride), ZnS or ZnO.

The additional electrode 14 is electrically connected to the Schottky electrode 12 and is formed on the passivation film 13 so that the Schottky electrode 12 is electrically accessible from the outside through the additional electrode 14. The additional electrode 14 may comprise one or more layers, each of which is made of Pt, Ru, Pd, Au, or Ni.

The antireflection film 15 is formed on a receiving portion of the ultraviolet receiver, i.e. a center region of the Schottky electrode 12 as shown in FIG. 1. The antireflection film 15 has a thickness of 1 to 200 nm and is ultraviolet-permeable. The antireflection film comprises one or more layers, each of which is made of $Al_2O_3$, $SiO_2$, SiNO, SiN, ZnS or ZnO.

The AZO thin film 16 is formed on the −c face of the zinc oxide single crystal substrate 11, and the ohmic electrode 17 is formed on the AZO thin film 16. The ohmic electrode 17 may comprise one or more layers, each of which is made of Al, Cr, Zn, Ti, Ru, Pd, Pt, Ni, In, Au, Cu or W.

Now, an explanation will be made about fabrication processes for the exemplary photovoltaic ultraviolet sensor according to the present embodiment, with reference to FIGS. 4 to 10.

Figure 4:
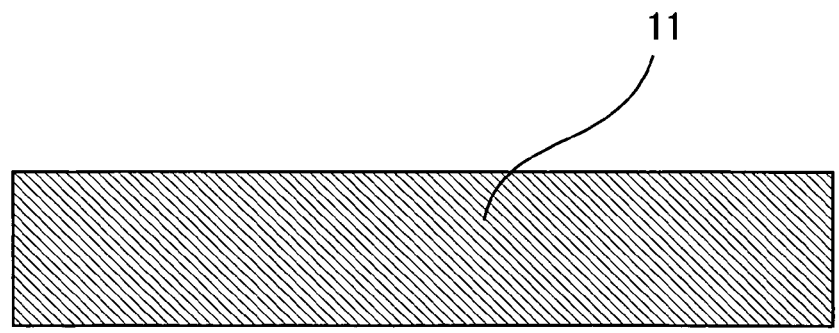
FIG. 4 is a sectional view showing a fabrication process for the photovoltaic ultraviolet sensor of FIG. 1.

First, the heat-treated wafer 2 including the zinc oxide single crystal substrates 11 is prepared in a manner as described above. However, FIG. 4 shows only one zinc oxide single crystal substrate 11, for the sake of clarity. For the same reason, FIGS. 5 to 10 are illustrated in connection with only one zinc oxide single crystal substrate 11. The illustrated zinc oxide single crystal substrate 11 has +c face as an upper surface and −c face as a lower surface.

Figure 5:
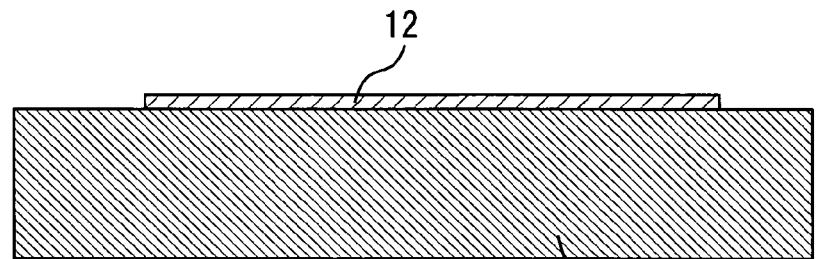
FIG. 5 is a sectional view showing a subsequent fabrication process for the photovoltaic ultraviolet sensor of FIG. 1.

Next, as shown in FIG. 5, the Schottky electrode 12 is formed, for example, by forming a first resist pattern on the upper surface of the zinc oxide single crystal substrate 11 by means of the photolithography technique, followed by forming a Pt thin film of 3 nm by means of the sputtering method, further followed by lifting off the first resist pattern together with the Pt thin film formed thereon.

Figure 6:
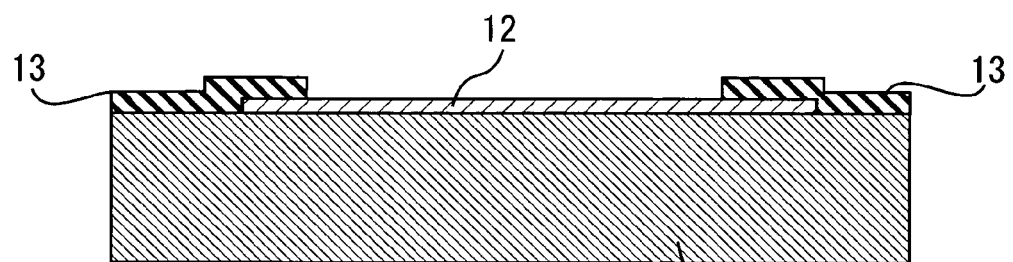
FIG. 6 is a sectional view showing a subsequent fabrication process for the photovoltaic ultraviolet sensor of FIG. 1.

Next, as shown in FIG. 6, the passivation film 13 is formed, for example, by forming a second resist pattern only covering the center area of the Schottky electrode 12, followed by forming a $SiO_2$ thin film of 200 nm by means of the sputtering method, further followed by lifting off the second resist pattern together with the $SiO_2$ thin film formed thereon. After the formation of the passivation film 13, the thus obtained intermediate product is subjected to a heat treatment process.

Figure 7:
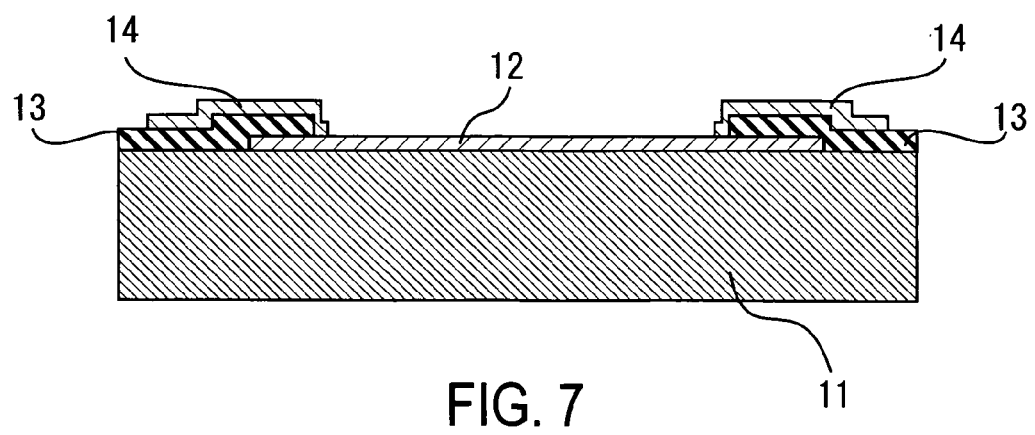
FIG. 7 is a sectional view showing a subsequent fabrication process for the photovoltaic ultraviolet sensor of FIG. 1.

Next, as shown in FIG. 7, the additional electrode 14 is formed, for example, by forming a third resist pattern, followed by forming a Pt thin film of 300 nm by means of the sputtering method, further followed by lifting off the third resist pattern together with the Pt thin film formed thereon, wherein the third resist pattern has two parts, one of which is a center pattern smaller than the second resist pattern and deposited on the center area of the Schottky electrode 12, the other one is a peripheral pattern having a first width and positioned on the peripheral portion of the passivation film 13.

Figure 8:
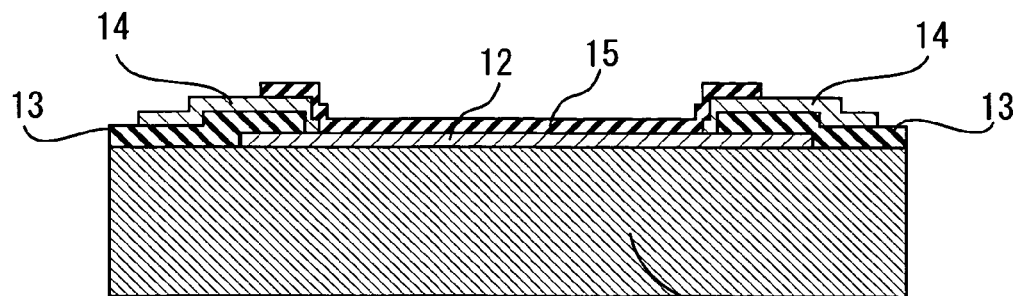
FIG. 8 is a sectional view showing a subsequent fabrication process for the photovoltaic ultraviolet sensor of FIG. 1.

Next, as shown in FIG. 8, the antireflection film 15 is formed, for example, by forming a fourth resist pattern on the peripheral portion of the thus obtained intermediate product, followed by forming a $SiO_2$ thin film of 60 nm by means of the sputtering method, further followed by lifting off the fourth resist pattern together with the $SiO_2$ thin film formed thereon, wherein the fourth resist pattern has a second width wider than the first width of the third resist pattern. After the formation of the antireflection film 15, the thus obtained intermediate product is subjected to a heat treatment process.

Figure 9:
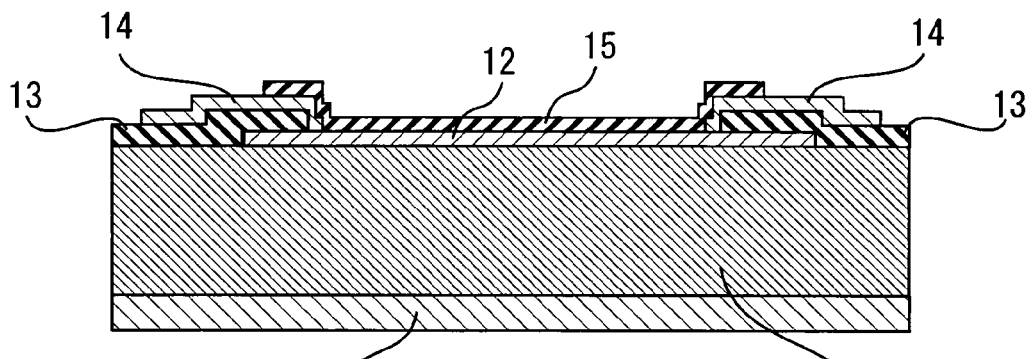
FIG. 9 is a sectional view showing a subsequent fabrication process for the photovoltaic ultraviolet sensor of FIG. 1.

Next, as shown in FIG. 9, the AZO thin film 16 is formed on the lower surface of the zinc oxide single crystal substrate 11, for example, by the sputtering method, wherein the exemplary AZO thin film 16 has a thickness of 100 nm.

Figure 10:
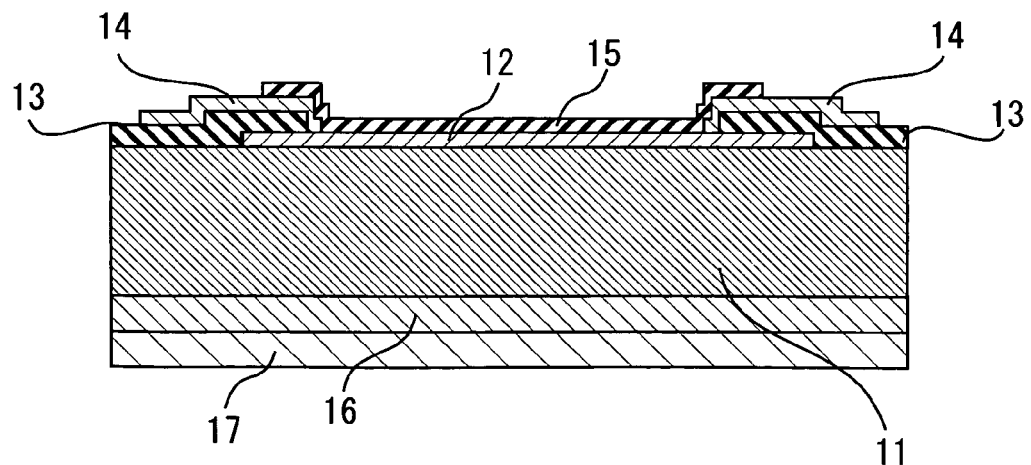
FIG. 10 is a sectional view showing a subsequent fabrication process for the photovoltaic ultraviolet sensor of FIG. 1.

Next, as shown in FIG. 10, an Al thin film of 300 nm is formed as the ohmic electrode 17 on the AZO thin film 16, for example, by the sputtering method. After that, as mentioned above, the wafer is diced into the ultraviolet sensor chips, each of which has a size of 1 mm(H)×1 mm(W)×0.3 mm(T).

Figure 11:
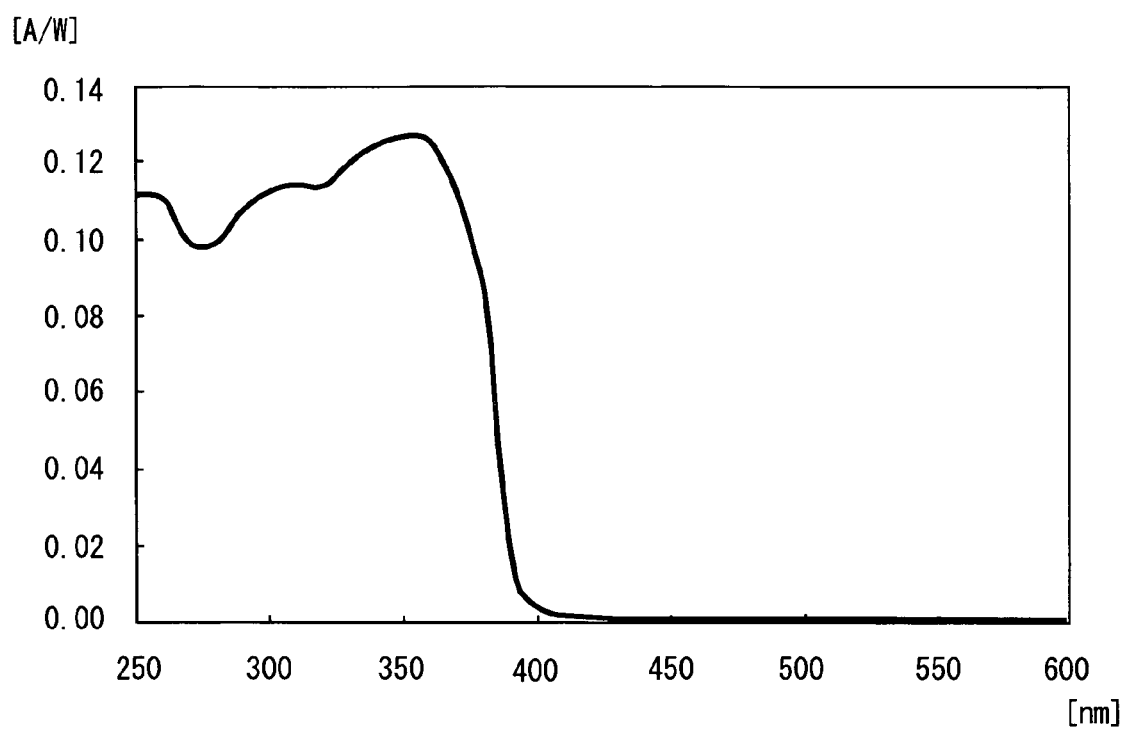
FIG. 11 is a view showing a sensing characteristic of the photovoltaic ultraviolet sensor of FIG. 1.

The thus obtained ultraviolet sensor according to the present embodiment has an ultraviolet sensing characteristic shown in FIG. 11. The measured bandwidth is from 250 nm to 600 nm, while the response bandwidth is from 250 nm to 380 nm. As understood from the illustrated characteristic, the ultraviolet sensor of the present embodiment is usable for sensing UV-A (ultraviolet A) of 320 to 400 nm, UV-B (ultraviolet B) of 280 to 320 nm, and UV-C (ultraviolet C) of 280 nm or smaller. The illustrated characteristic further shows that the exemplary ultraviolet sensor has a sensitivity peak on approximately 350 nm but does not have any sensitivity to the visible rays. In addition, the exemplary ultraviolet sensor has a relatively fast response of several microseconds.

Figure 12:
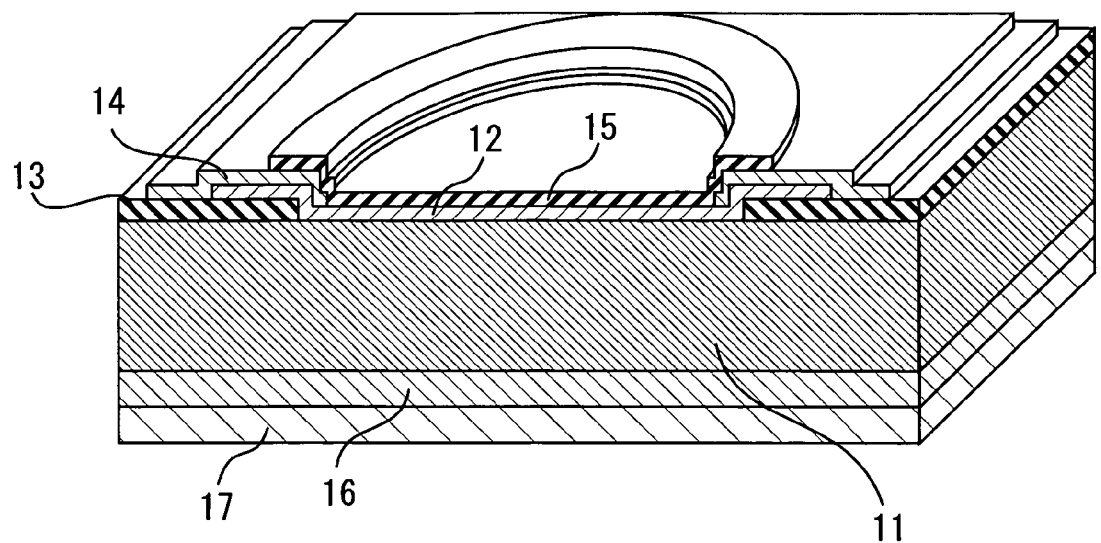
FIG. 12 is a partially-sectional, perspective view showing a photovoltaic ultraviolet sensor according to a second embodiment of the present invention.

Next explanation will be made about a photovoltaic ultraviolet sensor according to a second embodiment of the present invention, with reference to FIG. 12.

The ultraviolet sensor of the present embodiment is a modification of the ultraviolet sensor of the first embodiment. In this connection, like numerals are used to denote like elements in FIGS. 1 and 12. Comparing FIGS. 1 and 12, the ultraviolet sensor of the present embodiment has a structure similar to that of the first embodiment except that the passivation film 13 is formed under the peripheral part of the Schottky electrode 12.

The ultraviolet sensor of the present embodiment can be obtained in the following manner described hereinafter with reference to FIGS. 13 to 19.

Figure 13:
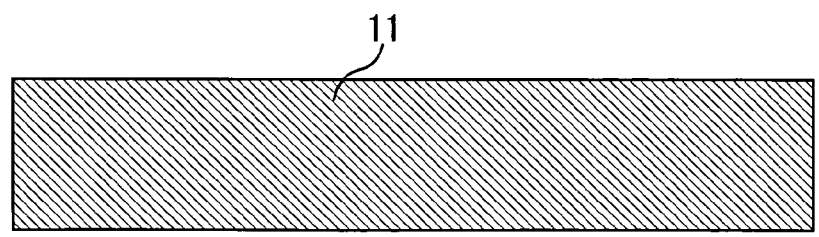
FIG. 13 is a sectional view showing a fabrication process for the photovoltaic ultraviolet sensor of FIG. 12.

First, the heat-treated wafer including the zinc oxide single crystal substrates 11 is prepared as shown in FIG. 13. The illustrated zinc oxide single crystal substrate 11 has +c face as an upper surface and −c face as a lower surface.

Figure 14:
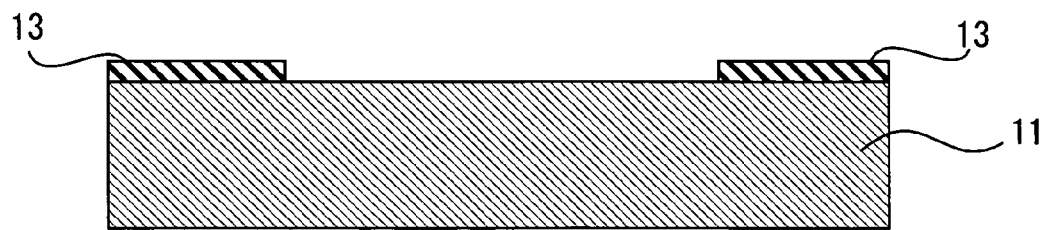
FIG. 14 is a sectional view showing a subsequent fabrication process for the photovoltaic ultraviolet sensor of FIG. 12.

Next, as shown in FIG. 14, the passivation film 13 is formed, for example, by forming an $Al_2O_3$ thin film of 200 nm by means of the sputtering method on the upper surface of the zinc oxide single crystal substrate 11, followed by forming a first resist pattern on the peripheral portion of the $Al_2O_3$ thin film, further followed by etching the $Al_2O_3$ thin film by the use of the first resist pattern as a mask. After the formation of the passivation film 13, the thus obtained intermediate product is subjected to a heat treatment process.

Figure 15:
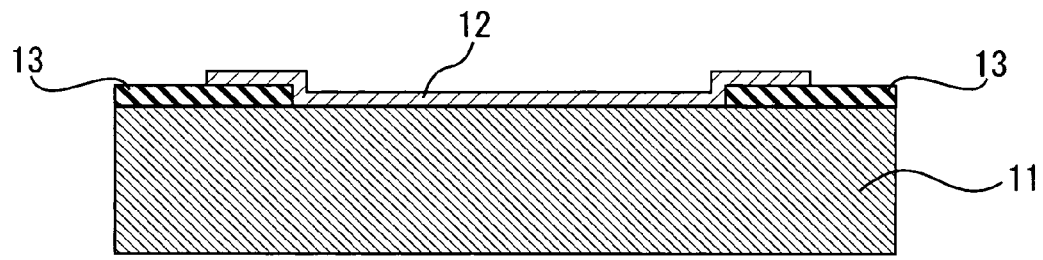
FIG. 15 is a sectional view showing a subsequent fabrication process for the photovoltaic ultraviolet sensor of FIG. 12.

Next, as shown in FIG. 15, the Schottky electrode 12 is formed, for example, by forming a Pt thin film of 3 nm on a region including an exposed portion of the upper surface of the zinc oxide single crystal substrate 11 by means of the sputtering method and photolithography techniques.

Figure 16:
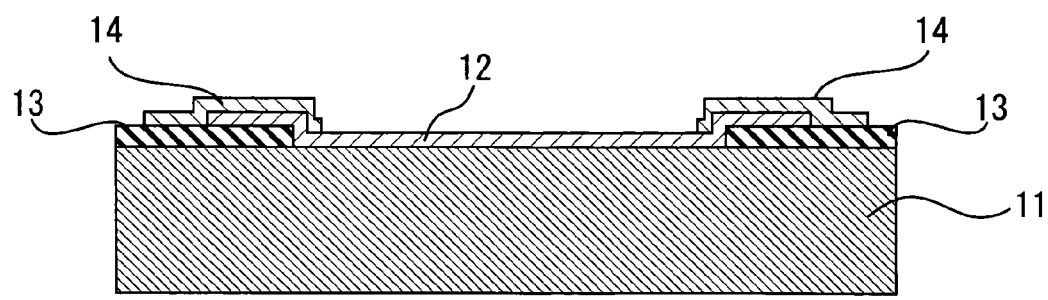
FIG. 16 is a sectional view showing a subsequent fabrication process for the photovoltaic ultraviolet sensor of FIG. 12.

Next, as shown in FIG. 16, the additional electrode 14 is formed, for example, by forming a second resist pattern, followed by forming a Pt thin film of 300 nm by means of the sputtering method, further followed by lifting off the second resist pattern together with the Pt thin film formed thereon, wherein the second resist pattern has two parts, one of which is a center pattern deposited on the center area of the Schottky electrode 12, the other one is a peripheral pattern having a first width and positioned on the peripheral portion of the passivation film 13.

Figure 17:
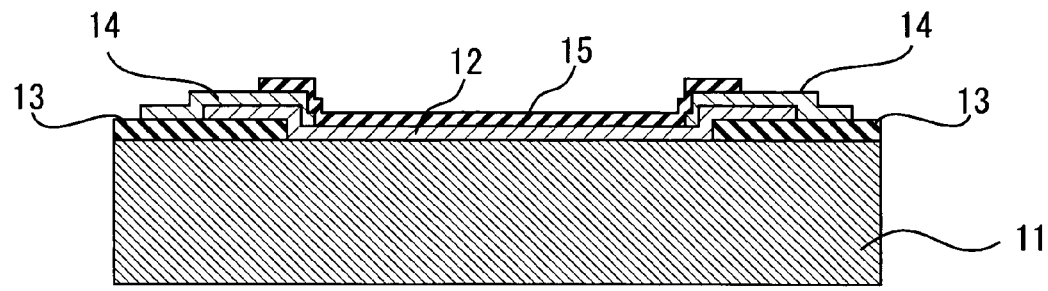
FIG. 17 is a sectional view showing a subsequent fabrication process for the photovoltaic ultraviolet sensor of FIG. 12.

Next, as shown in FIG. 17, the antireflection film 15 is formed, for example, by forming a third resist pattern on the peripheral portion of the thus obtained intermediate product, followed by forming a $SiO_2$ thin film of 60 nm by means of the sputtering method, further followed by lifting off the third resist pattern together with the $SiO_2$ thin film formed thereon, wherein the third resist pattern has a second width wider than the first width of the second resist pattern. After the formation of the antireflection film 15, the thus obtained intermediate product is subjected to a heat treatment process.

Figure 18:
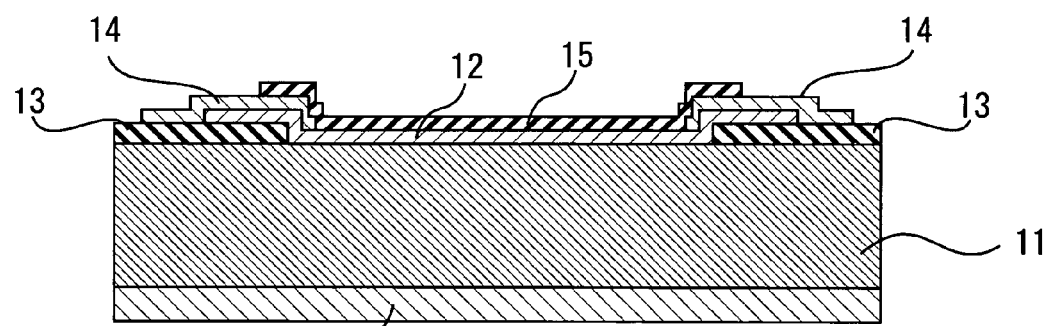
FIG. 18 is a sectional view showing a subsequent fabrication process for the photovoltaic ultraviolet sensor of FIG. 12.

Next, as shown in FIG. 18, the AZO thin film 16 is formed on the lower surface of the zinc oxide single crystal substrate 11, for example, by the sputtering method, wherein the exemplary AZO thin film 16 has a thickness of 100 nm.

Figure 19:
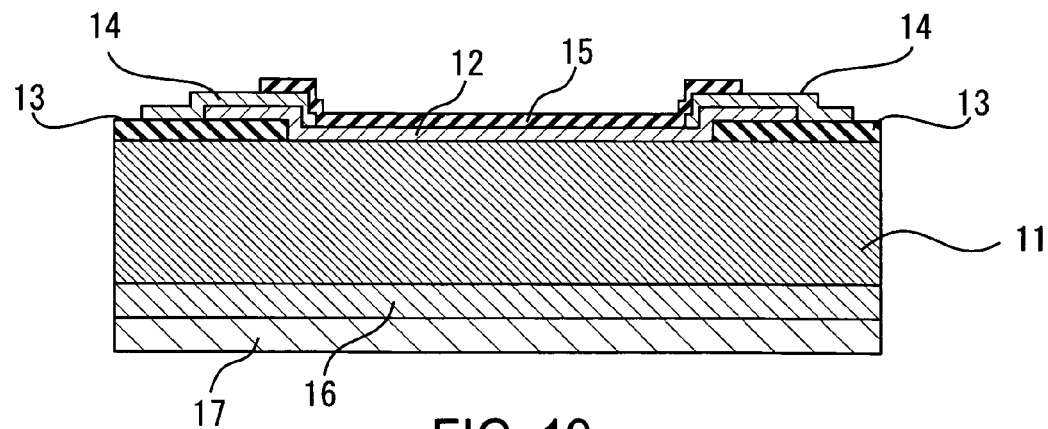
FIG. 19 is a sectional view showing a subsequent fabrication process for the photovoltaic ultraviolet sensor of FIG. 12.

Next, as shown in FIG. 19, an Al thin film of 300 nm is formed as the ohmic electrode 17 on the AZO thin film 16, for example, by the sputtering method. After that, as mentioned above, the wafer is diced into the ultraviolet sensor chips, each of which has a size of 1 mm (H)×1 mm (W)×0.3 mm (T).

Next explanation will be made about a photovoltaic ultraviolet sensor according to a third embodiment of the present invention, with reference to FIGS. 20 to 25. The ultraviolet sensor of the present embodiment is a modification of the ultraviolet sensor of the first embodiment. In this connection, like numerals are used to denote like elements in FIGS. 1 and 20 to 25.

Figure 25:
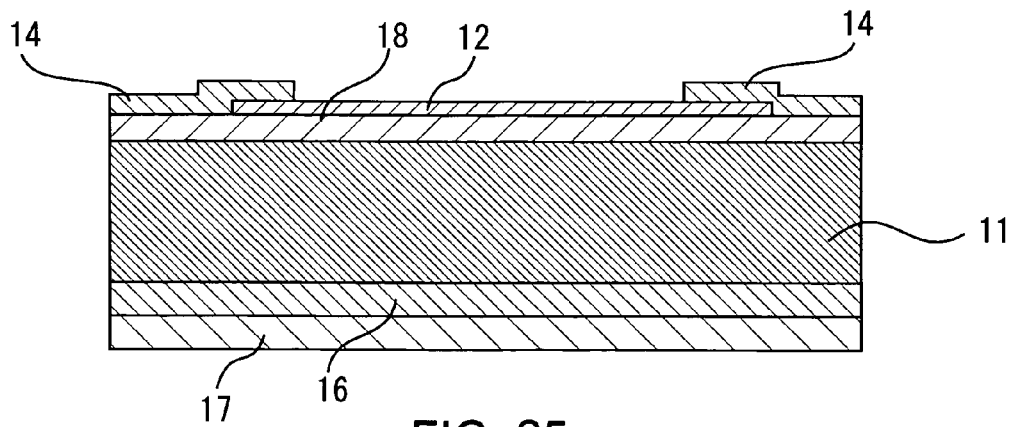
FIG. 25 is a sectional view showing a subsequent fabrication process for the photovoltaic ultraviolet sensor of FIG. 20.

Comparing FIGS. 1 and 25, the ultraviolet sensor of the present embodiment has a structure similar to that of the first embodiment except for two points. One point is that an adjustment thin film 18 is interposed between the zinc oxide single crystal substrate 11 and the Schottky electrode 12. The other point is that the ultraviolet sensor of the present embodiment neither has the passivation film 13 nor the antireflection film 15. However, the passivation film 13 and/or the antireflection film 15 may be included in a manner similar to the first or the second embodiment.

The adjustment thin film 18 is a thin film whose resistivity, conduction type, i.e. n- or p- type, and/or band gap are adjusted by adding at least one kind additive into a base material. The adjustment thin film 18 of the present embodiment comprises a zinc oxide based thin film. In addition, the adjustment thin film 18 of the zinc oxide based thin film may comprise at least one layer which is a chemical compound selected from the group consisting of Ca, Mg, S, Al, Cd, Se, Ga, N, Cu and Te.

The ultraviolet sensor of the present embodiment can be obtained in the following manner described hereinafter with reference to FIGS. 20 to 25.

Figure 20:
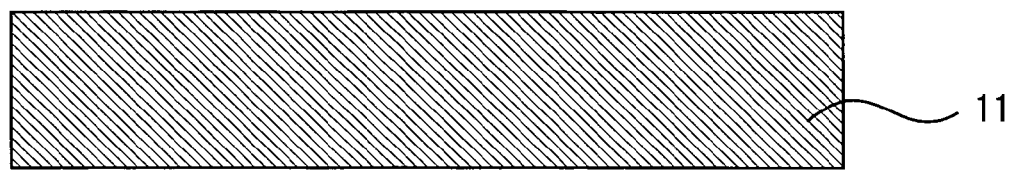
FIG. 20 is a sectional view showing a fabrication process for a photovoltaic ultraviolet sensor according to a third embodiment of the present invention.

First, the heat-treated wafer including the zinc oxide single crystal substrates 11 is prepared as shown in FIG. 20. The illustrated zinc oxide single crystal substrate 11 has +c face as an upper surface and −c face as a lower surface.

Figure 21:
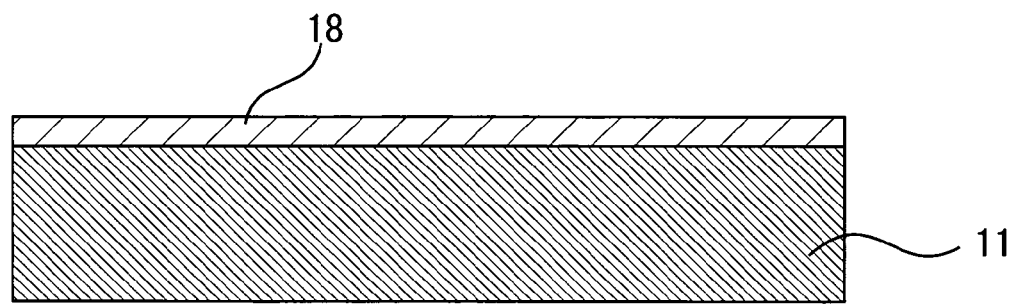
FIG. 21 is a sectional view showing a subsequent fabrication process for the photovoltaic ultraviolet sensor of FIG. 20.

Next, as shown in FIG. 21, the adjustment thin film 18 is formed over the +c face of the zinc oxide single crystal substrate 11, for example, by the MOCVD method, wherein the adjustment thin film 18 is an epitaxial layered zinc oxide based thin film into which Al is added as an additive. The exemplary adjustment thin film 18 has resistivity of 100 to 500 $\Omega$cm and is of n-type.

Figure 22:
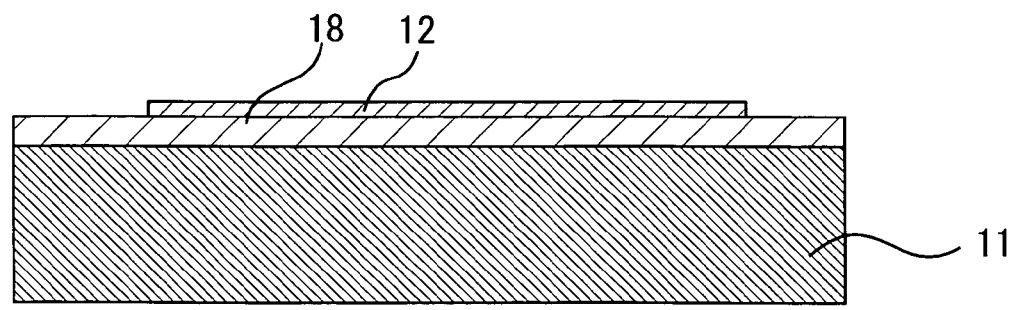
FIG. 22 is a sectional view showing a subsequent fabrication process for the photovoltaic ultraviolet sensor of FIG. 20.

Next, as shown in FIG. 22, the Schottky electrode 12 is formed on the adjustment thin film 18, for example, by forming a Pt thin film of 3 nm by means of the sputtering method. The Schottky electrode 12 and the adjustment thin film 18 constitute a Schottky barrier and, when the Schottky electrode 12 receives ultraviolet rays, produce a voltage.

Figure 23:
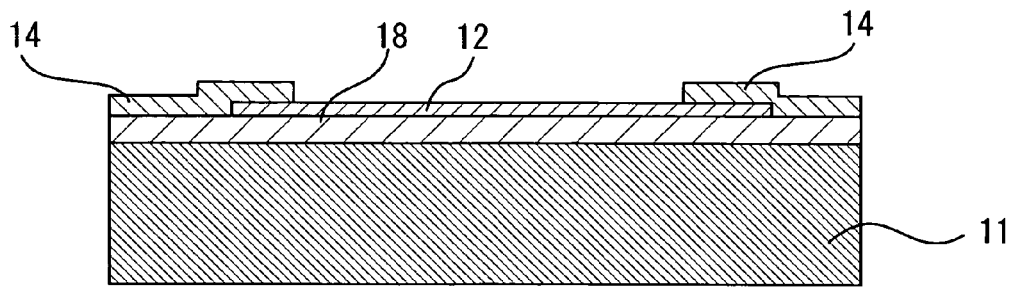
FIG. 23 is a sectional view showing a subsequent fabrication process for the photovoltaic ultraviolet sensor of FIG. 20.

Next, as shown in FIG. 23, the additional electrode 14 is formed, for example, by forming a predetermined resist pattern, followed by forming a Pt thin film of 300 nm by means of the sputtering method, further followed by lifting off the predetermined resist pattern together with the Pt thin film formed thereon.

Figure 24:
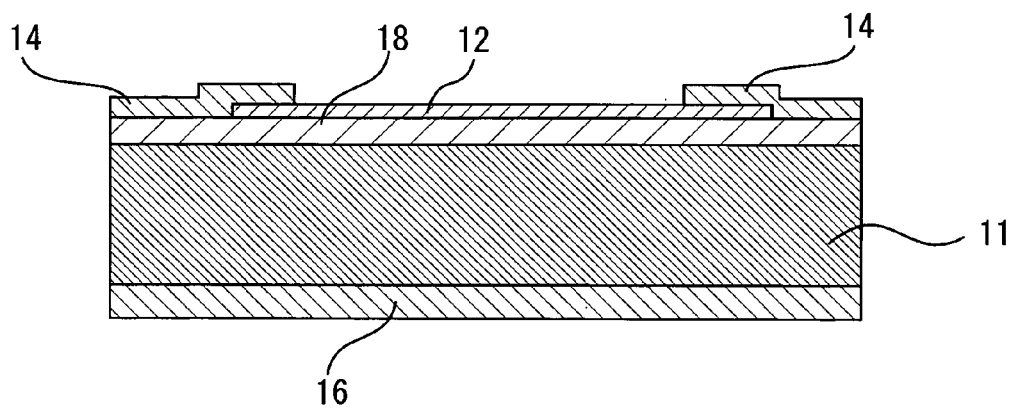
FIG. 24 is a sectional view showing a subsequent fabrication process for the photovoltaic ultraviolet sensor of FIG. 20.

Next, as shown in FIG. 24, the AZO thin film 16 is formed on the −c face of the zinc oxide single crystal substrate 11, for example, by the sputtering method, wherein the exemplary AZO thin film 16 has a thickness of 100 nm.

Next, as shown in FIG. 25, an Al thin film of 300 nm is formed as the ohmic electrode 17 on the AZO thin film 16, for example, by the sputtering method. After that, as mentioned above, the wafer is diced into the ultraviolet sensor chips, each of which has a size of 1 mm (H)×1 mm (W)×0.3 mm (T).

Next explanation will be made about a photovoltaic ultraviolet sensor according to a fourth embodiment of the present invention, with reference to FIGS. 26 to 31. The photovoltaic ultraviolet sensor according to the present embodiment has not a Schottky junction but a p-n junction, different from the first to the third embodiments. However, because there are similar elements, for example, in FIGS. 1 and 26 to 31, like numerals are used to denote like elements.

The zinc oxide single crystal substrate 11 of the present embodiment is of n-type. On the zinc oxide single crystal substrate 11, a p-type thin film 19 is formed. The p-type thin film 19 may comprise a p-type zinc oxide thin film, a p-type zinc oxide based thin film, or a p-type nitride thin film such as p-type GaN thin film. In addition, the p-type thin film 19 of the zinc oxide based thin film may comprise at least one layer which is a chemical compound selected from the group consisting of Ca, Mg, S, Al, Cd, Se, Ga, N, Cu and Te. On the other hand, the p-type thin film 19 of the nitride thin film may comprise at least one layer which is a chemical compound selected from the group consisting of Ga, Al and In.

The ultraviolet sensor of the present embodiment can be obtained in the following manner described hereinafter with reference to FIGS. 26 to 31.

Figure 26:
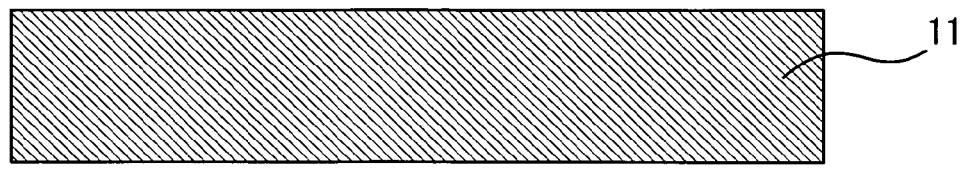
FIG. 26 is a sectional view showing a fabrication process for a photovoltaic ultraviolet sensor according to a fourth embodiment of the present invention.

First, the heat-treated wafer including the n-type zinc oxide single crystal 10 substrates 11 is prepared as shown in FIG. 26. The illustrated zinc oxide single crystal substrate 11 has +c face as an upper surface and −c face as a lower surface.

Figure 27:
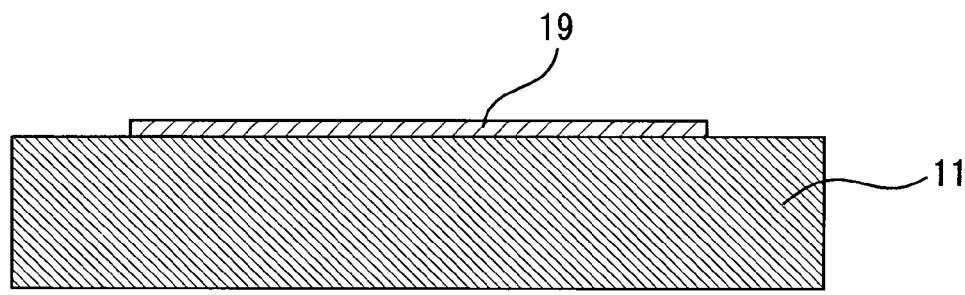
FIG. 27 is a sectional view showing a subsequent fabrication process for the photovoltaic ultraviolet sensor of FIG. 26.

Next, as shown in FIG. 27, the p-type thin film 19 is formed directly on the +c face of the zinc oxide single crystal substrate 11, for example, by the MOCVD method, wherein the p-type thin film 19 is an epitaxial layered zinc oxide thin film or a GaN thin film.

Figure 28:
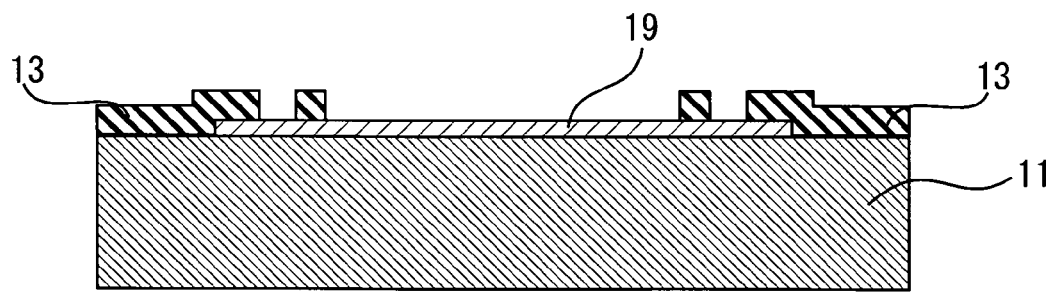
FIG. 28 is a sectional view showing a subsequent fabrication process for the photovoltaic ultraviolet sensor of FIG. 26.

Next, as shown in FIG. 28, the passivation film 13 is formed, for example, by forming an $Al_2O_3$ thin film of 200 nm by means of the sputtering method over the upper surface of the zinc oxide single crystal substrate 11 and the p-type thin film 19, followed by forming a first resist pattern on the $Al_2O_3$ thin film, further followed by etching the $Al_2O_3$ thin film by the use of the first resist pattern as a mask. The etching process provides the passivation film 13 with a centered large aperture and a contact hole which has an annular shape. After the formation of the passivation film 13, the thus obtained intermediate product is subjected to a heat treatment process.

Figure 29:
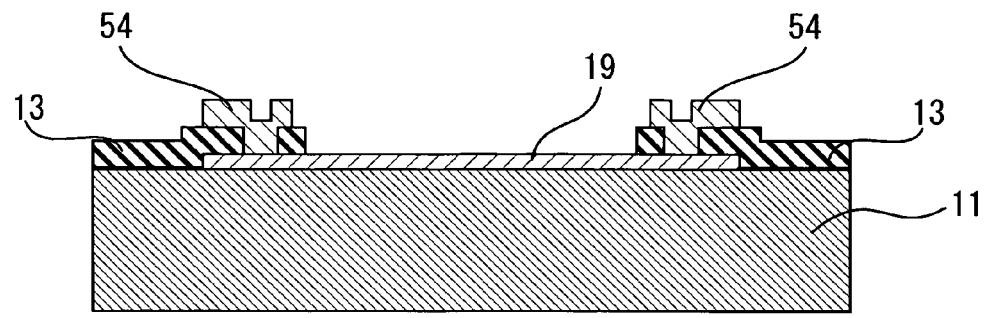
FIG. 29 is a sectional view showing a subsequent fabrication process for the photovoltaic ultraviolet sensor of FIG. 26.

Next, as shown in FIG. 29, a first ohmic electrode 54 is formed, for example, by forming a second resist pattern, followed by forming a Ni thin film of 100 nm by means of the sputtering method, further followed by forming an Au thin film of 200 nm by means of the sputtering method, further followed by lifting off the predetermined resist pattern together with the Ni thin film and the Au thin film formed thereon.

Figure 30:
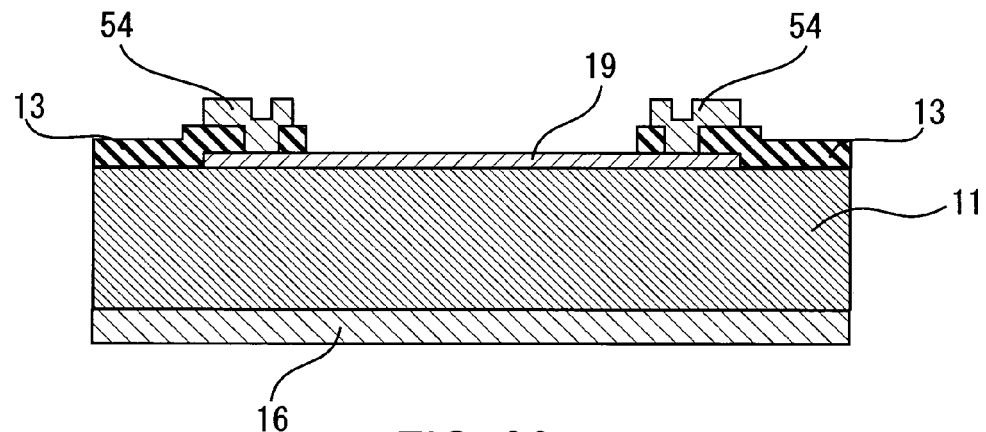
FIG. 30 is a sectional view showing a subsequent fabrication process for the photovoltaic ultraviolet sensor of FIG. 26.

Next, as shown in FIG. 30, the AZO thin film 16 is formed on the −c face of the zinc oxide single crystal substrate 11, for example, by the sputtering method, wherein the exemplary AZO thin film 16 has a thickness of 100 nm.

Figure 31:
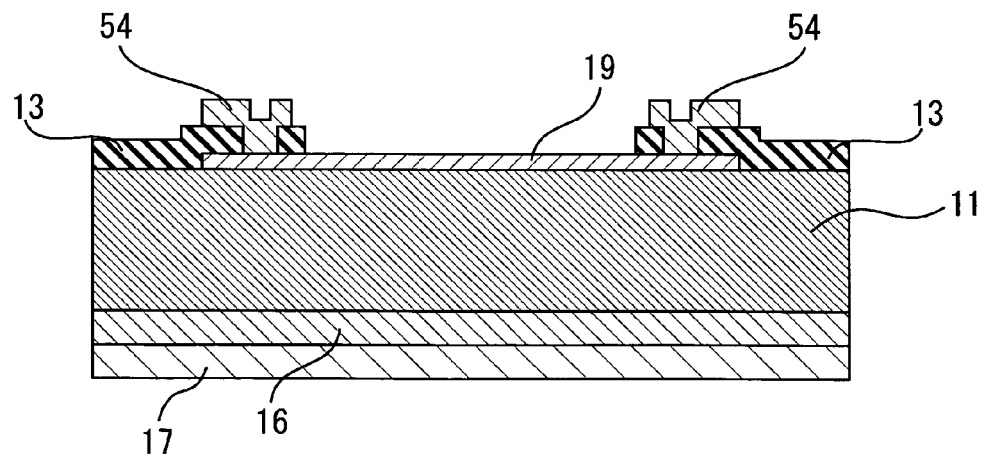
FIG. 31 is a sectional view showing a subsequent fabrication process for the photovoltaic ultraviolet sensor of FIG. 26.

Next, as shown in FIG. 31, an Al thin film of 300 nm is formed as a second ohmic electrode 17 on the AZO thin film 16, for example, by the sputtering method. After that, as mentioned above, the wafer is diced into the ultraviolet sensor chips, each of which has a size of 1 mm (H)×1 mm (W)×0.3 mm (T).

Although the ultraviolet sensor of the present embodiment does not have an antireflection film, an antireflection film may be formed in a manner similar to the first or the second embodiment.

Next explanation will be made about a photovoltaic ultraviolet sensor according to a fifth embodiment of the present invention, with reference to FIGS. 32 to 37. The ultraviolet sensor of the present embodiment is a modification of the ultraviolet sensor of the third embodiment. In this connection, like numerals are used to denote like elements in FIGS. 20 to 25 and 32 to 37. The ultraviolet sensor of the present embodiment has a structure similar to that of the third embodiment except that the adjustment thin film 21 is made not of a zinc oxide based thin film but of a nitride thin film interposed between the zinc oxide single crystal substrate 11 and the Schottky electrode 12. The adjustment thin-film 21 of the nitride thin film may comprise at least one layer which is a chemical compound selected from the group consisting of Ga, Al and In.

The ultraviolet sensor of the present embodiment can be obtained in the following manner described hereinafter with reference to FIGS. 32 to 37.

Figure 32:
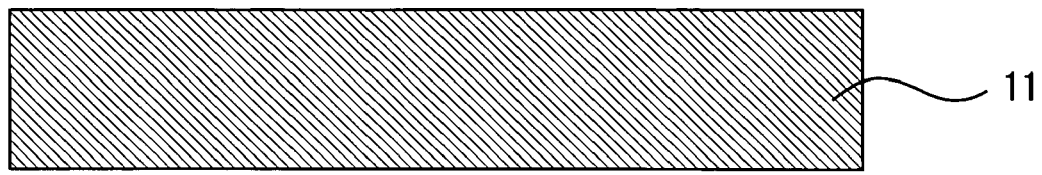
FIG. 32 is a sectional view showing a fabrication process for a photovoltaic ultraviolet sensor according to a fifth embodiment of the present invention.

First, the heat-treated wafer including the zinc oxide single crystal substrates 11 is prepared as shown in FIG. 32. The illustrated zinc oxide single crystal substrate 11 has +c face as an upper surface and −c face as a lower surface.

Figure 33:
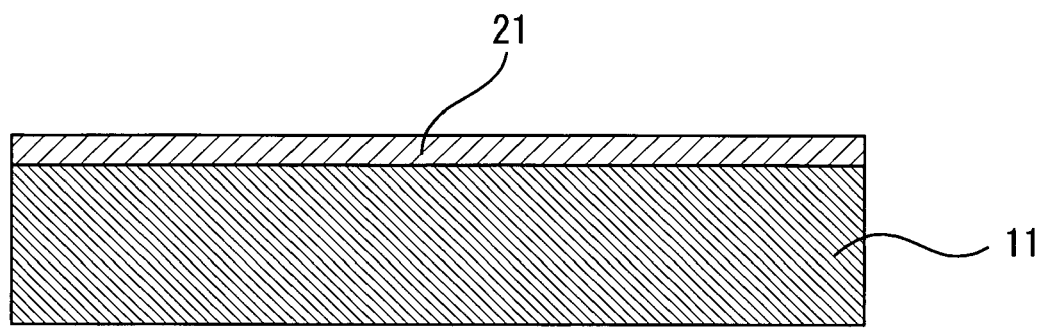
FIG. 33 is a sectional view showing a subsequent fabrication process for the photovoltaic ultraviolet sensor of FIG. 32.

Next, as shown in FIG. 33, the adjustment thin film 21 is formed over the +c face of the zinc oxide single crystal substrate 11, for example, by the MOCVD method, wherein the adjustment thin film 21 is an epitaxial layered n-type GaN. The exemplary adjustment thin film 21 has a thickness of 1 µm.

Figure 34:
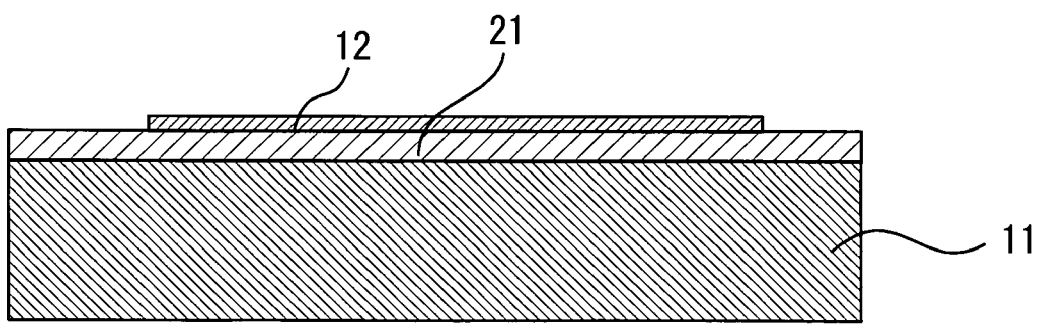
FIG. 34 is a sectional view showing a subsequent fabrication process for the photovoltaic ultraviolet sensor of FIG. 32.

Next, as shown in FIG. 34, the Schottky electrode 12 is formed on the adjustment thin film 21, for example, by forming a Pt thin film of 3 nm by means of the sputtering method. The Schottky electrode 12 and the adjustment thin film 21 constitute a Schottky barrier and, when the Schottky electrode 12 receives ultraviolet rays, produce a voltage.

Figure 35:
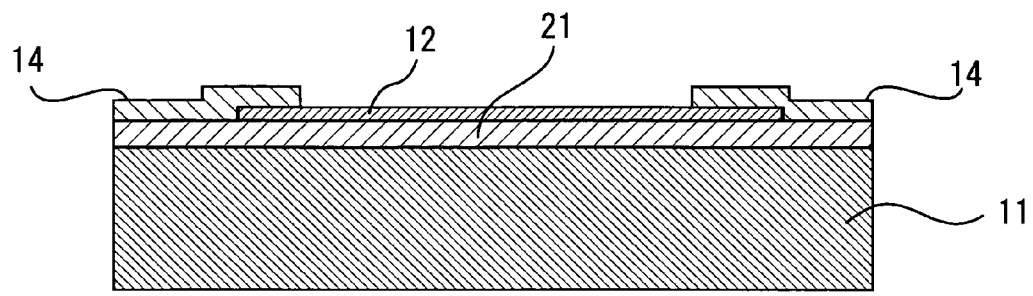
FIG. 35 is a sectional view showing a subsequent fabrication process for the photovoltaic ultraviolet sensor of FIG. 32.

Next, as shown in FIG. 35, the additional electrode 14 is formed, for example, by forming a predetermined resist pattern, followed by forming a Pt thin film of 300 nm by means of the sputtering method, further followed by lifting off the predetermined resist pattern together with the Pt thin film formed thereon.

Figure 36:
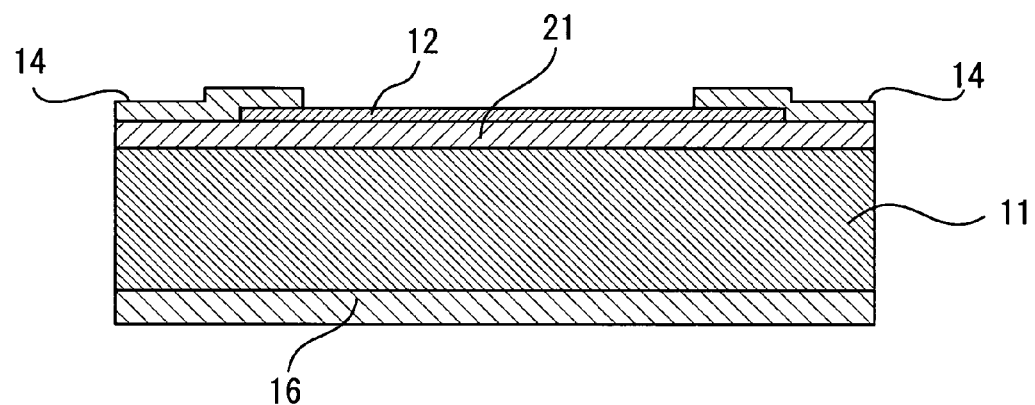
FIG. 36 is a sectional view showing a subsequent fabrication process for the photovoltaic ultraviolet sensor of FIG. 32.

Next, as shown in FIG. 36, the AZO thin film 16 is formed on the −c face of the zinc oxide single crystal substrate 11, for example, by the sputtering method, wherein the exemplary AZO thin film 16 has a thickness of 100 nm.

Figure 37:
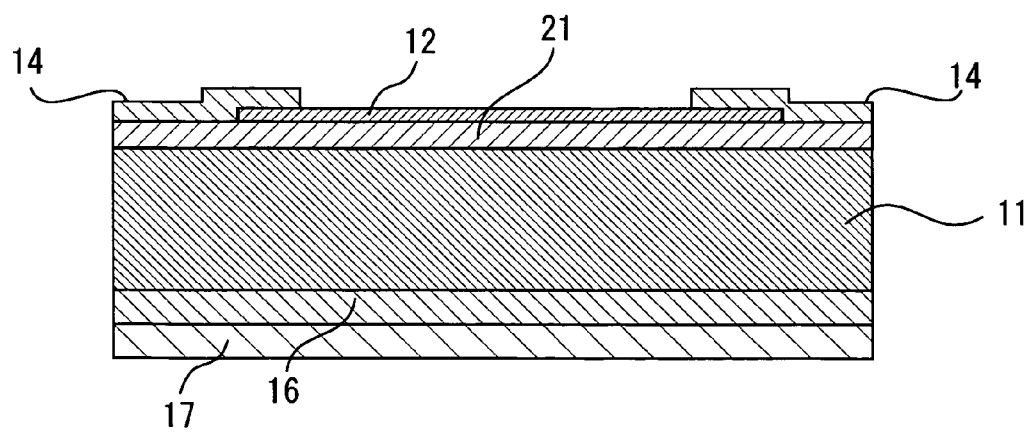
FIG. 37 is a sectional view showing a subsequent fabrication process for the photovoltaic ultraviolet sensor of FIG. 32.

Next, as shown in FIG. 37, an Al thin film of 300 nm is formed as the ohmic electrode 17 on the AZO thin film 16, for example, by the sputtering method. After that, as mentioned above, the wafer is diced into the ultraviolet sensor chips, each -of which has a size of 1 mm (H)×1 mm (W)×0.3 mm (T).

Although the ultraviolet sensor of the present embodiment neither has a passivation film nor an antireflection film, a passivation film and/or an antireflection film may be formed in a manner similar to the first or the second embodiment.

The preferred embodiments of the present invention will be better understood by those skilled in the art by reference to the above description and figures. The description and preferred embodiments of this invention illustrated in the figures are not to intend to be exhaustive or to limit the invention to the precise form disclosed. They are chosen to describe or to best explain the principles of the invention and its applicable and practical use to thereby enable others skilled in the art to best utilize the invention.

While there has been described what is believed to be the preferred embodiment of the invention, those skilled in the art will recognize that other and further modifications may be made thereto without departing from the sprit of the invention, and it is intended to claim all such embodiments that fall within the true scope of the invention.

What is claimed is:

1. A photovoltaic ultraviolet sensor comprising: a zinc oxide single crystal having a +c face and a −c face opposite to the +c face; and an ultraviolet receiver which is formed on the +c face of the zinc oxide single crystal and, when receiving ultraviolet rays, produces a voltage solely or in cooperation with the zinc oxide single crystal, wherein the ultraviolet receiver comprises a Schottky electrode formed on the +c face of the zinc oxide single crystal, and wherein the photovoltaic ultraviolet sensor further comprising an Al doped ZnO layer formed on the −c face of the zinc oxide single crystal.

2. The photovoltaic ultraviolet sensor according to claim 1, wherein the ultraviolet receiver comprises an adjustment thin film directly formed on the +c face of the zinc oxide single crystal and a Schottky electrode formed on the adjustment thin film.

3. The photovoltaic ultraviolet sensor according to claim 2, wherein the adjustment thin film comprises a zinc oxide based thin film.

4. The photovoltaic ultraviolet sensor according to claim 3, wherein the zinc oxide based thin film comprises at least one layer which is an element selected from the group consisting of Ca, Mg, S, Al, Cd, Se, Ga, N, Cu and Te.

5. The photovoltaic ultraviolet sensor according to claim 2, wherein the adjustment thin film comprises a nitride thin film.

6. The photovoltaic ultraviolet sensor according to claim 5, wherein the nitride thin film comprises at least one layer which is an element selected from the group consisting of Ga, Al and In.

7. The photovoltaic ultraviolet sensor according to claim 1, wherein the Schottky electrode is ultraviolet-permeable.

8. The photovoltaic ultraviolet sensor according to claim 1, wherein the Schottky electrode comprises one or more layers, each of which is made of Pt, Ru, Pd, Au, Ni, Ir, Os, Re, Rh, Te or W.

9. The photovoltaic sensor according to claim 1, further comprising an antireflection film, wherein the ultraviolet receiver has a receiving portion, and the antireflection film covers the receiving portion.

10. The photovoltaic ultraviolet sensor according to claim 9, wherein the antireflection film has a thickness of 1 to 200 nm.

11. The photovoltaic ultraviolet sensor according to claim 9, wherein the antireflection film is ultraviolet-permeable.

12. The photovoltaic ultraviolet sensor according to claim 9, wherein the antireflection film comprises one or more layers, each of which is made of $Al_2O_3$, $SiO_2$, SiNO, SiN, ZnS or ZnO.

13. The photovoltaic ultraviolet sensor according to claim 1, further comprising a passivation film, wherein the zinc oxide single crystal has a first peripheral region on the +c face of the zinc oxide single crystal, the ultraviolet receiver has a second peripheral part positioned on the first peripheral region, and the passivation film covers at least one of the first peripheral region and the second peripheral part.

14. The photovoltaic ultraviolet sensor according to claim 13, wherein the passivation film comprises at least a layer made of $Al_2O_3$, $SiO_2$, SiNO, SiN, AlN, SIALON, ZnS or ZnO.

15. The photovoltaic ultraviolet sensor according to claim 1, wherein the zinc oxide single crystal is one obtainable by carrying out a heat treatment for a base material of zinc oxide single crystal under an oxygen-containing atmosphere within a container made of zinc oxide.

16. The photovoltaic ultraviolet sensor according to claim 1, wherein the Schottky electrode is formed directly on the +c face of the zinc single crystal.

* * * * *